(12) United States Patent
Cha (10) Patent No.: US 8,128,449 B2
(45) Date of Patent: Mar. 6, 2012

(54) METHOD OF MAKING ELECTRONIC DEVICE WITH FRIT SEAL AND FRIT SEALING APPARATUS

(75) Inventor: You Min Cha, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 1073 days.

(21) Appl. No.: 11/529,913

(22) Filed: Sep. 29, 2006

(65) Prior Publication Data

US 2007/0170856 A1    Jul. 26, 2007

(30) Foreign Application Priority Data

Jan. 26, 2006  (KR) .................. 10-2006-0008457

(51) Int. Cl.
    *H01J 9/26* (2006.01)
(52) U.S. Cl. ........................... 445/25; 445/24
(58) Field of Classification Search .......... 445/24–25, 445/66
    See application file for complete search history.

(56) References Cited

U.S. PATENT DOCUMENTS

| | | | |
|---|---|---|---|
| 4,238,704 A | | 12/1980 | Bonk et al. |
| 4,914,671 A | * | 4/1990 | Yagi et al. .................... 372/103 |
| 6,011,607 A | | 1/2000 | Yamazaki et al. |
| 6,555,025 B1 | | 4/2003 | Krupetsky et al. |
| 6,703,643 B2 | | 3/2004 | Yamazaki et al. |
| 6,825,910 B2 | | 11/2004 | Aoki et al. |
| 2004/0152392 A1 | * | 8/2004 | Nakamura ..................... 445/25 |
| 2004/0207314 A1 | | 10/2004 | Aitken et al. |
| 2006/0084348 A1 | * | 4/2006 | Becken et al. ................. 445/25 |
| 2007/0128967 A1 | * | 6/2007 | Becken et al. ................. 445/25 |

FOREIGN PATENT DOCUMENTS

| | | |
|---|---|---|
| JP | 59-79600 | 5/1984 |
| JP | 60-191898 | 9/1985 |
| JP | 04-356351 | 12/1992 |
| JP | 09-102534 | 4/1997 |
| JP | 09-278483 | 10/1997 |
| JP | 10-064414 | 3/1998 |
| JP | 10-074583 | 3/1998 |
| JP | 10-082589 | 3/1998 |
| TW | 560220 | 11/2003 |
| WO | WO03/048835 A2 | 6/2003 |
| WO | WO 2004-095597 A2 | 11/2004 |
| WO | WO2005/119803 A2 | 12/2005 |

OTHER PUBLICATIONS

Japanese Office Action dated Aug. 25, 2009 for Japanese Patent Application No. 2006-143199.
Extended European Search Report issued by the European Patent Office dated May 13, 2011.

* cited by examiner

*Primary Examiner* — Anne Hines
(74) *Attorney, Agent, or Firm* — Knobbe Martens Olson & Bear LLP (57) ABSTRACT

Disclosed is a frit sealing apparatus and method of using the same, the apparatus being capable of irradiating infrared rays only to a frit portion of a substrate. The apparatus includes a first chamber, a second chamber positioned inside the first chamber, a lamp positioned inside the second chamber, a stage positioned outside the first chamber to receive and fix a first mother substrate and a second mother substrate, an emitting part formed in the first chamber and the second chamber and positioned to direct heat supplied by the lamp to the stage. The apparatus also includes a mask positioned over the substrates, the mask including one or more transmitting portions positioned over regions containing the frit, and one or more interrupting portions positioned at other regions.

7 Claims, 8 Drawing Sheets

FIG. 7E

METHOD OF MAKING ELECTRONIC DEVICE WITH FRIT SEAL AND FRIT SEALING APPARATUS

CROSS-REFERENCE TO RELATED APPLICATIONS

This application claims the benefit of Korean Patent Application No. 2006-08457, filed on Jan. 26, 2006, in the Korean Intellectual Property Office, the disclosure of which is incorporated herein by reference in its entirety.

BACKGROUND OF THE INVENTION

1. Field of the Invention

The present invention relates to organic light-emitting display devices. More particularly, the invention relates to packaging of organic light-emitting display devices.

2. Description of the Related Art

In general, an organic light-emitting display device comprises a first substrate comprising a pixel region and a non-pixel region and a second substrate opposed and disposed to the first substrate and bonded to the first substrate with sealant such as epoxy for encapsulation.

In the pixel region of the first substrate a plurality of organic light-emitting diodes are formed at intersecting portions of scan lines and data lines in the form of a matrix. Each organic light-emitting diode comprises i) an anode electrode, ii) a cathode electrode and iii) an organic thin film layer. The organic thin film layer may comprise a hole transporting layer, the cathode electrode, a light-emitting layer, and an electron transporting layer. The organic thin film layer may be formed between the anode electrode and the cathode electrode.

Since the organic light-emitting diode includes organic material, it is vulnerable to degradation in the presence of oxygen. Further, since the cathode electrode is made of metal material, it may be oxidized by moisture in the air so as to degrade its electrical characteristic and light-emitting characteristics. To prevent this, a moisture absorbent material is mounted on a container, e.g., manufactured in the form of a can or cup made of metal material, or on a second substrate of organic, plastic, etc., in the form of powder, or adhered thereto in the form of a film, thereby removing moisture that penetrates from the surroundings.

However, the method of mounting the moisture absorbent material in the form of powder can cause problems such as complicating the process, increasing material and process costs, increasing the thickness of a display device, and being difficult to apply to a top emitting (front light-emitting) display configuration. Also, the method of adhering moisture absorbent material in the form of a film can cause problems in that it is limited in its ability to remove moisture and it is difficult to apply to mass production due to low durability and reliability.

Therefore, in order to solve such problems, there has been proposed a method of encapsulating an organic light-emitting display device by forming a sidewall with frit. Typically, the frit forming process includes inserting a substrate into a chamber and irradiating the substrate with a laser beam or infrared rays, thereby bonding the frit to the substrate. However, when the substrate is inserted into the chamber, since heat is transferred to the overall area of the substrate, the thin film transistor and the organic light-emitting diode formed on the substrate are at risk of being damaged.

The discussion of this section is to provide a general background of organic light-emitting devices and does not constitute an admission of prior art.

SUMMARY OF CERTAIN INVENTIVE ASPECTS

An aspect of the invention provides a frit sealing apparatus. This apparatus includes a radiation source configured to radiate a ray therefrom, a platform comprising a receiving surface configured to receive an unfinished electronic device, the unfinished electronic device comprising a first substrate, a second substrate, an array of organic light emitting pixels and a frit, the array interposed between the first and second substrates, the frit interposed between and contacting the first and second substrates while surrounding the array. The device further includes a mask located between the radiation source and the platform, the mask comprising one or more masking portions configured to substantially block the ray from radiating the platform, and one or more transmitting portions configured to substantially allow the ray to radiate the platform, wherein the platform is configured to slide relative to the radiation source.

In the above described apparatus the radiation source may emit an infrared ray. The apparatus may further include the unfinished electronic device. The transmitting portions may substantially allow the ray to radiate at least a portion of the frit of the unfinished electronic device, and the masking portions may substantially block the ray from radiating at least a portion of the array. The apparatus may further include a motor configured to slide the platform relative to the radiation source. The unfinished electronic device may further comprise one or more additional arrays of organic light emitting pixels interposed between the first and second substrates, and one or more additional frits interposed between and contacting the first and second substrates while surrounding the one or more additional arrays.

Another aspect of the invention provides a method of making an electronic device comprising an organic light emitting display. This method includes providing an unfinished device comprising a first substrate, a second substrate, an array of organic light emitting pixels and a frit, the array interposed between the first and second substrates, the frit interposed between and contacting the first and second substrates while surrounding the array; positioning a mask comprising a transmitting window over the first substrate of the unfinished device such that the transmitting window is located over the frit of the unfinished device. The method further includes providing a radiation source configured to radiate a ray therefrom, adjusting the relative position of the unfinished device and the radiation source by moving the unfinished device relative to the source such that a ray from the radiation source can be directed to the transmitting window, and directing the ray from the radiation source to the frit through the transmitting window of the mask, wherein the ray directed to the frit melts at least part of the frit so as to fuse the frit with the first and second substrates.

In the method described above, the moving may comprise a vertical moving of the unfinished device, in which the distance between the radiation source and the unfinished device changes. The moving may comprise a lateral moving of the unfinished device, in which the distance between the radiation source and the unfinished device does not substantially change. Adjusting the relative position may comprise positioning the unfinished device such that the transmitting window of the mask is placed immediately above or below the radiation source. The method may further include providing a slidable platform and placing the unfinished device on the platform, wherein adjusting the relative position comprises sliding the platform relative to the radiation source. Directing the ray may comprise selectively radiating the ray from the radiation source when the position of the unfinished device relative to the radiating source is proper. The method may further include blocking the ray or disabling radiation of the ray when the ray is directed to mask other than the transmitting window until the relative position of the unfinished device and the radiation source is properly adjusted. The method may further include, after directing the ray, moving the unfinished device relative to the radiation source such that the ray from the radiation source can be directed to a non-radiated portion of the transmitting window. The method may further include, while directing the ray, moving the unfinished device relative to the radiation source such that the ray from the radiation source can be continuously directed to a non-radiated portion of the transmitting window.

Still referring to the above described method, the first substrate may be a single layer substrate. The first substrate may comprise two or more layers of different materials. The radiation source comprises a laser or an infrared lamp. The unfinished device may comprise a plurality of additional arrays of organic light emitting pixels and a plurality of additional frits, which are interposed between the first and second substrates, one of the additional frits surrounding one of the additional arrays, and wherein the mask comprises a plurality of additional transmitting windows, one of the additional transmitting windows is located so as to pass the ray toward one of the additional frits. The method may further include, after directing the ray to the frit, moving the unfinished device relative to the radiation source such that the ray from the radiation source can be directed to the one of the additional transmitting windows. The method may further include, after moving the unfinished device, directing the ray to the one of the additional frits through the one of the additional transmitting windows. The method may further include cutting the resulting product into a plurality of pieces to provide an electronic device comprising a piece of the first substrate, a piece of the second substrate, one array of organic light emitting pixels interposed between the pieces and one frit bonded to and interposed between the pieces while surrounding the one array.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF CERTAIN INVENTIVE EMBODIMENTS

Embodiments of the present invention will be described with reference to the accompanying drawings. Herein, when one element is described as being connected to another element, one element may be not only directly connected to another element but may also be indirectly connected to another element via yet another element. Further, irrelevant elements are omitted for clarity. Also, like reference numerals refer to like elements throughout.

An organic light emitting display (OLED) is a display device comprising an array of organic light emitting diodes. Organic light emitting diodes are solid state devices which include an organic material and are adapted to generate and emit light when appropriate electrical potentials are applied.

Figure 7A:
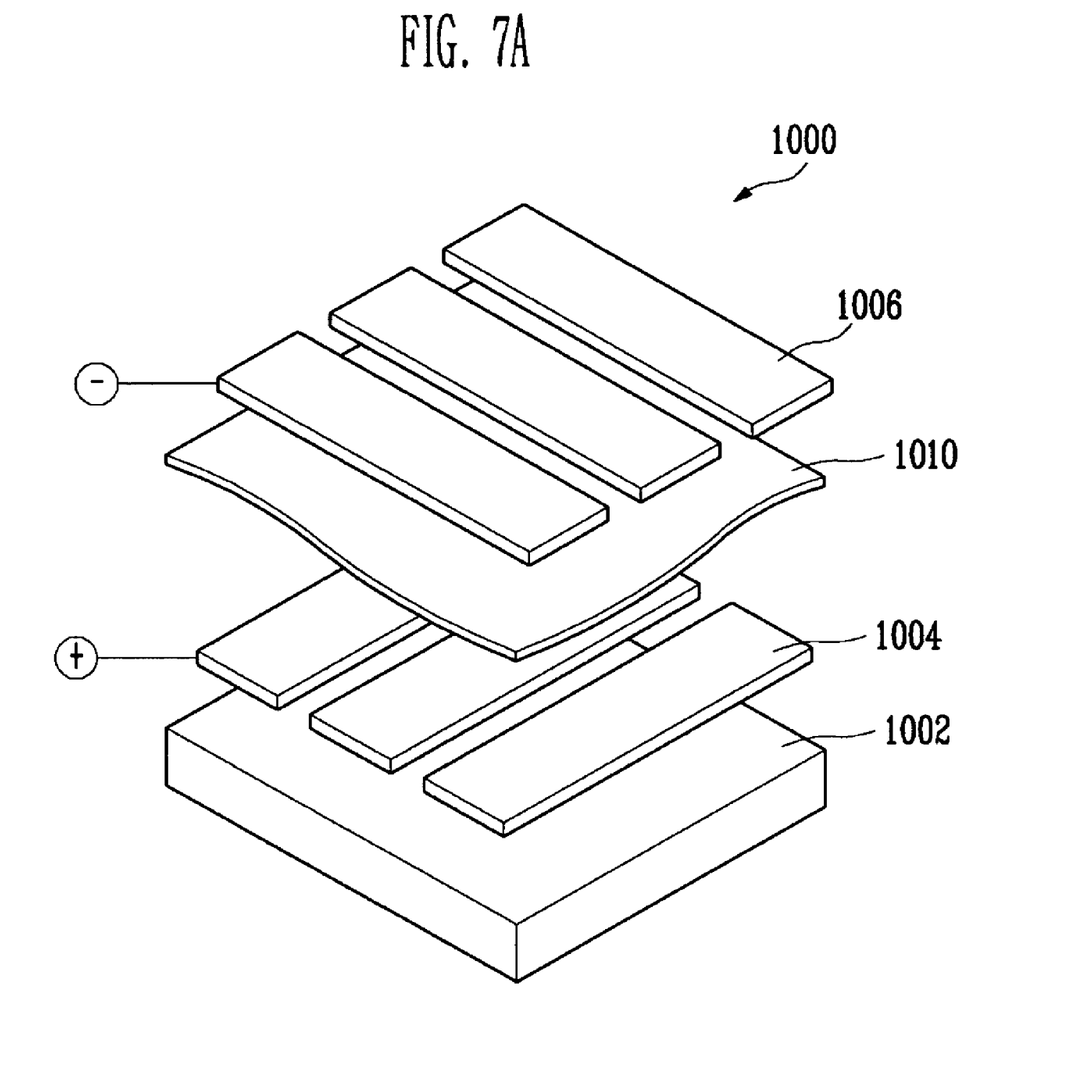
FIG. 7A is a schematic exploded view of a passive matrix type organic light emitting display device in accordance with one embodiment.
Figure 7B:
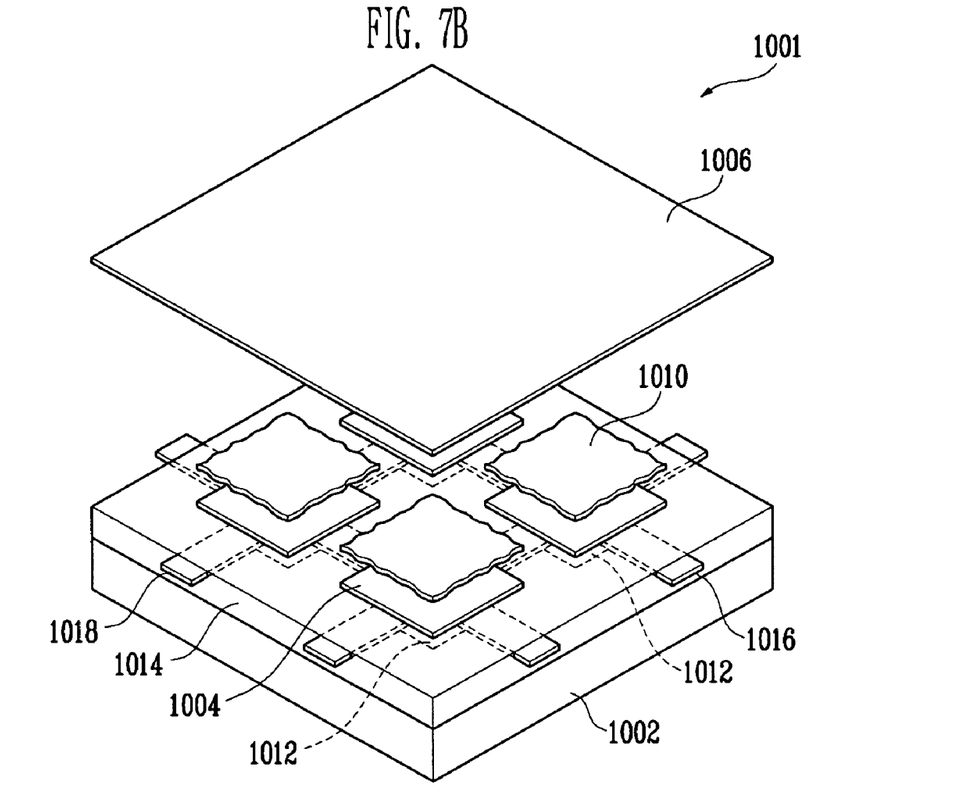
FIG. 7B is a schematic exploded view of an active matrix type organic light emitting display device in accordance with one embodiment.

OLEDs can be generally grouped into two basic types dependent on the arrangement with which the stimulating electrical current is provided. FIG. 7A schematically illustrates an exploded view of a simplified structure of a passive matrix type OLED 1000. FIG. 7B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 7A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 7B, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT.

AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is oppositely arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 7C:
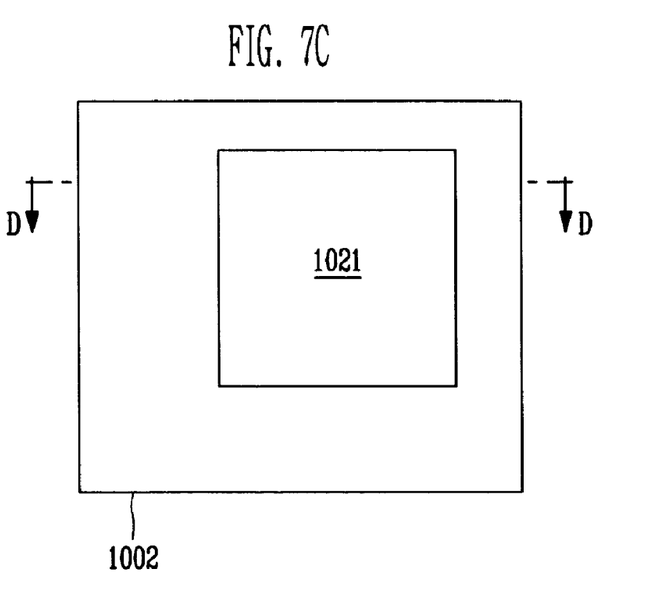
FIG. 7C is a schematic top plan view of an organic light emitting display in accordance with one embodiment.

In many embodiments, an OLED pixel array 1021 comprising a plurality of organic light emitting pixels is arranged over a substrate 1002 as shown in FIG. 7C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 7D:
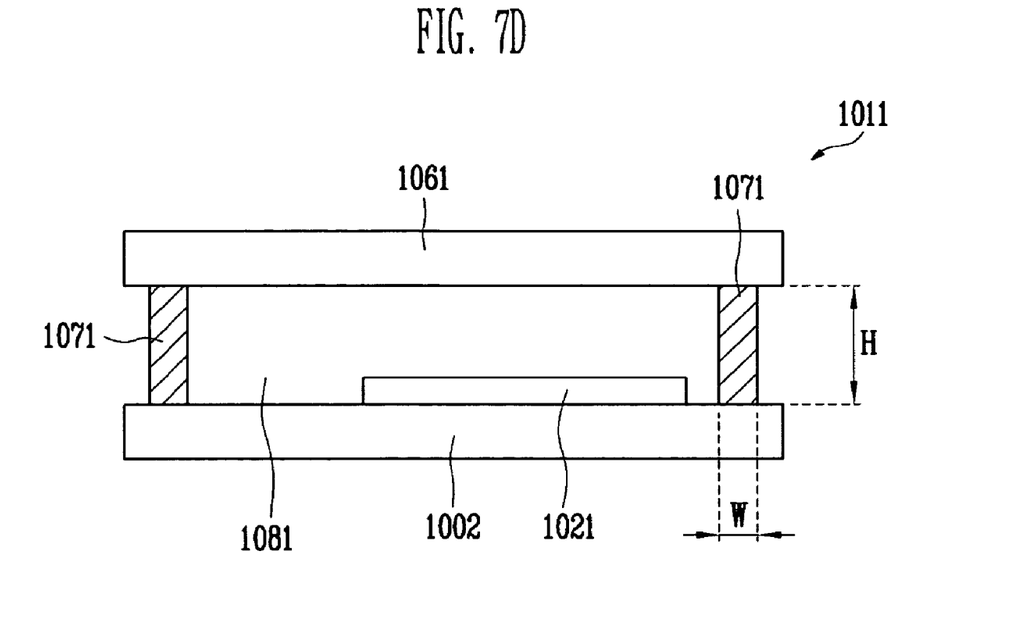
FIG. 7D is a cross-sectional view of the organic light emitting display of FIG. 7C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 7D schematically illustrates a cross-section of an encapsulated OLED device 1011 having a layout of FIG. 7C and taken along the line d-d of FIG. 7C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 7D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 7D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide (Li2O), sodium oxide (Na2O), potassium oxide (K2O), boron oxide (B2O3), vanadium oxide (V2O5), zinc oxide (ZnO), tellurium oxide (TeO2), aluminum oxide (Al2O3), silicon dioxide (SiO2), lead oxide (PbO), tin oxide (SnO), phosphorous oxide (P2O5), ruthenium oxide (Ru2O), rubidium oxide (Rb2O), rhodium oxide (Rh2O), ferrite oxide (Fe2O3), copper oxide (CuO), titanium oxide (TiO2), tungsten oxide (WO3), bismuth oxide (Bi2O3), antimony oxide (Sb2O3), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 7E:
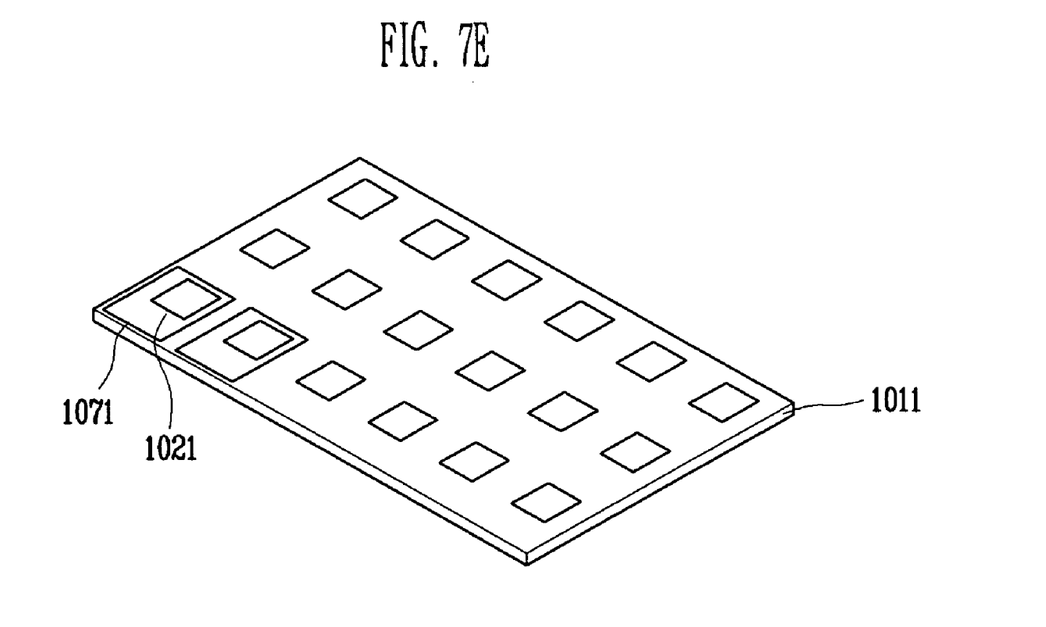
FIG. 7E is a schematic perspective view illustrating mass production of organic light emitting devices in accordance with one embodiment.

In some embodiments, OLED devices 1011 are mass produced. In an embodiment illustrated in FIG. 7E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 7D. In certain embodiments, the individual OLED devices 1011 then further undergo additional packaging operations to further improve the sealing formed by the frit seal 1071 and the top and bottom substrates 1061, 1002.

Figure 1:
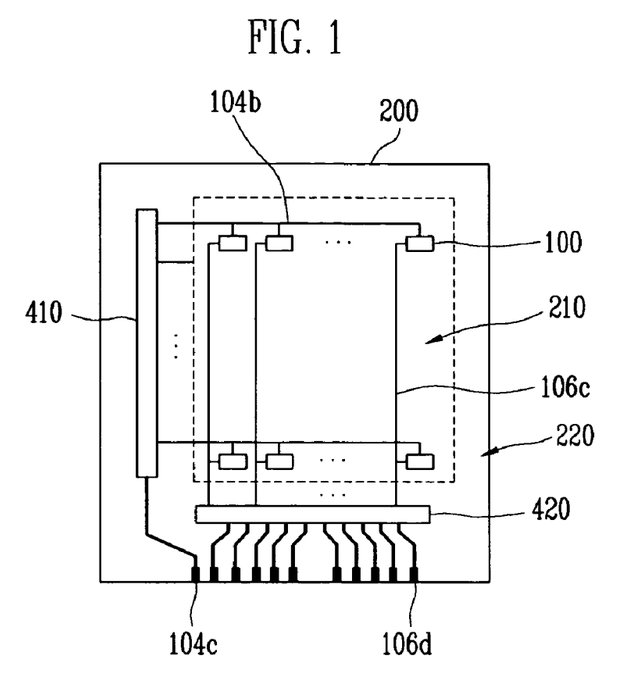
FIG. 1 is a view showing a first substrate of an organic light-emitting display device according to an embodiment.

FIG. 1 shows an organic light-emitting display device according to an embodiment of the present invention. Referring to FIG. 1, a first substrate 200 is comprised of a pixel region 210 and a non-pixel region 220 encompassing the pixel region 210. The pixel region 210 comprises formed scan lines 104b and data lines 106c, and pixels 100 are electrically connected to the scan lines 104b and the data lines 106c. The non-pixel region 220 is formed with a scan driver 410 connected with the scan lines 104b and a data driver 420 connected with the data lines 106c. The non-pixel region 220 is formed with a power supplying line (not shown) for supplying power to the pixels 100, as well as with pads 104c and 106d to be connected with an external driving circuit (not shown).

Each pixel 100 comprises an organic light-emitting diode (not shown) and at least one thin film transistor for driving the organic light-emitting diode. The organic light-emitting diode is comprised of an anode electrode, a cathode electrode; and an organic thin film layer comprising a hole transporting layer, a light-emitting layer, and an electron transporting layer, which are formed between the anode electrode and the cathode electrode. The thin film transistor comprises a gate electrode, a source electrode and a drain electrode and controls an amount of current supplied to the organic light-emitting diode. One of the pixels 100 is driven when the scan line 104b, connected to the pixel 100, is supplied with scan signals, and data signals are received from the data lines 106c, so as to generate a predetermined brightness of light corresponding to the received data signals.

The scan driver 410 sequentially supplies the scan signals to the scan lines 104b on the basis of control signals supplied from first pads 104c. As a result, the pixels 100 connected with the scan lines 104b are sequentially selected.

The data driver 420 receives data and control signals from second pads 106d. The data driver 420 receiving the data and control signals supplies the data signals to the data lines 106c. Here, the data signals supplied to the data lines 106c are supplied to the pixels 100 selected by the scan signals.

The pads 104c and 106d are electrically connected with the external driving circuit. Here, the first pads 104c are connected with the scan driver 410 to supply the control signal to the scan driver 410, thereby driving the scan driver 410. And, the second pads 106d are electrically connected with the data driver 420 to supply the control signal and data to the data driver 420, thereby driving the data driver 420.

Figure 2A:
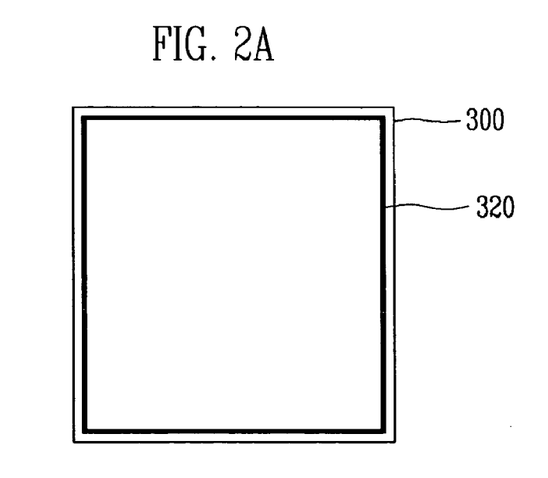
FIGS. 2a and 2b are views showing a second substrate opposed and bonded to the first substrate.
Figure 2B:
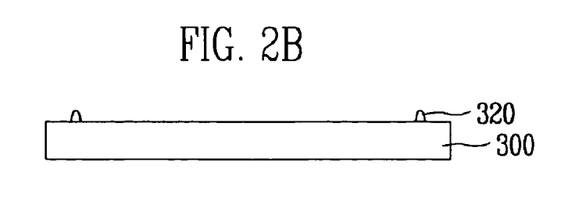

FIGS. 2a and 2b are a plan view and a sectional view of a second substrate bonded to a first substrate. Here, the second substrate (e.g., a sealing substrate 300) is bonded to the first substrate 200 (shown in FIG. 1) so as to prevent moisture from infiltrating into certain internal components of the pixel region 210.

Referring to FIGS. 2a and 2b, the second substrate 300 is provided with a frit 320 in order to bond to the first substrate 200. A process of producing the frit 320 will be briefly described as follows. In general, the frit, in the form of glass powder, is produced by rapidly falling temperature in the course of heating glass material at high temperature. When oxide powder is included in the frit in powder form and organic matter is then added to it, a paste in gel state is produced. The paste is applied to the edge of the second substrate 300 and then heated to a predetermined temperature, such that the organic matter burns and dissipates into the air and the paste in the gel state is cured and attached to the second substrate 300 in a solid-state frit 320. Here, the temperature at which the frit 320 burns is about 300° C. to about 500° C. In one aspect, the frit 320 is formed to a height (as measured perpendicular to the substrate 300 as shown in FIG. 2b) of about 14 μm to about 15 μm, and to a width (as measured parallel to the substrate 300 as shown in FIG. 2b) of about 0.6 mm to about 0.7 mm in order to be able to stably bond the second substrate 300 and the first substrate 200.

After forming the solid state frit 320, the first substrate 200 and the second substrate 300 are bonded together. When bonding the first substrate 200 and the second substrate 300, the pixel region 210 is encapsulated to prevent an infiltration of oxygen and moisture thereinto. To this end, when bonding the second substrate 300 and the first substrate 200, the frit 320 is preferably positioned in the non-pixel region 220. The frit 320 is then irradiated with infrared rays from an external source, until it is melted to bond the first substrate 200 and the second substrate 300.

Figure 3:
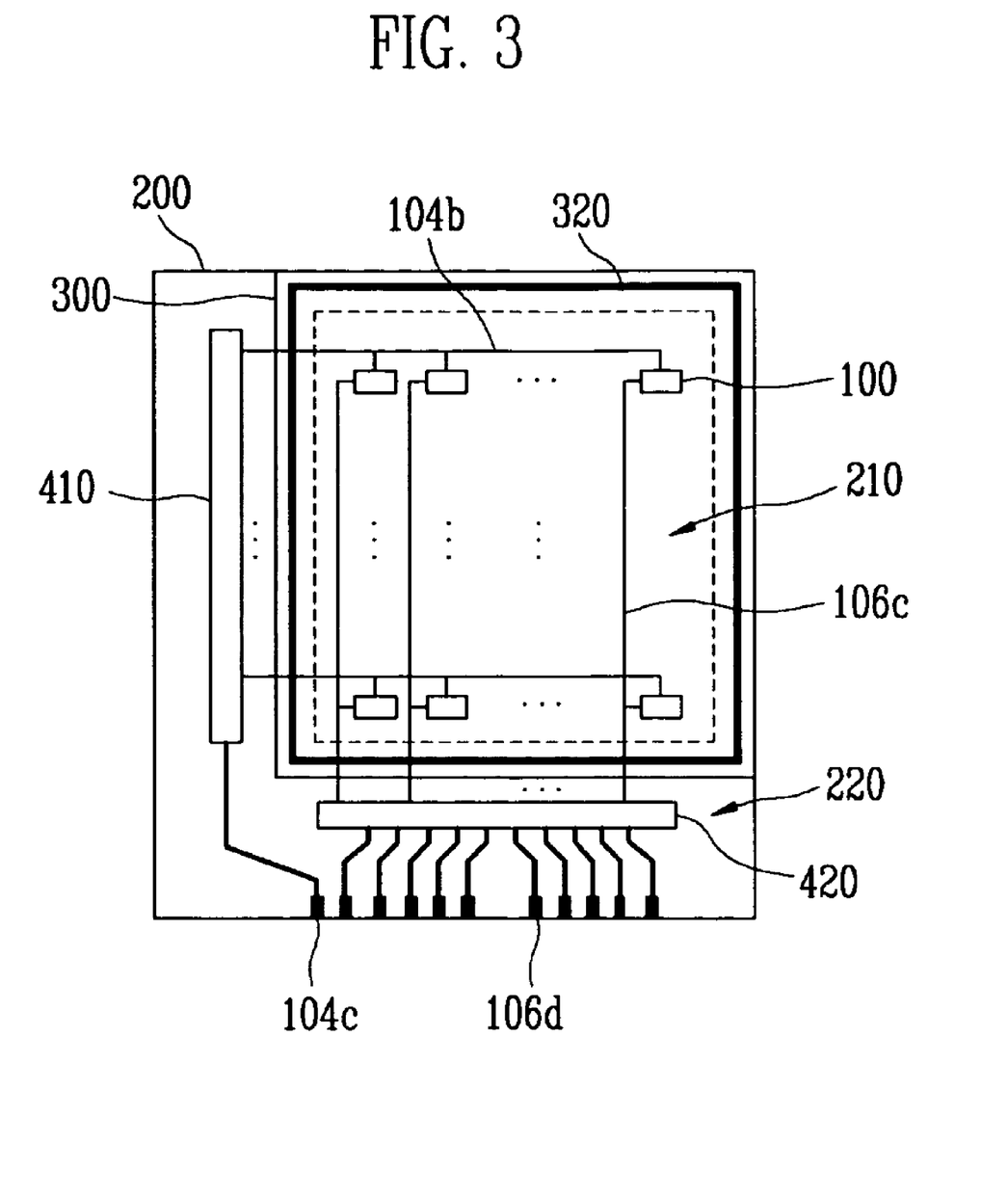
FIG. 3 is a schematic view showing an embodiment where the first substrate is bonded to the second substrate.

FIG. 3 is a schematic view of the first substrate 200 bonded to the second substrate 300. The frit 320 is positioned in the non-pixel region 220 to bond the first substrate 200 and the second substrate 300. In some embodiments, the frit 320 is positioned in the non-pixel region 220 and is then irradiated with infrared rays so that the frit 320 is melted and bonded to the first substrate 200, thereby bonding the first substrate 200 and the second substrate 300. After the frit 320 is melted, the first substrate 200 and the second substrate 300 are bonded by the frit 320, thereby preventing oxygen and moisture, etc., from infiltrating into the pixel region 210.

Although FIG. 3 shows the frit 320 positioned inside the scan driver 410, the present invention is not limited thereto. For example, the frit 320 can be positioned outside of the scan driver 410 to surround and/or overlap the scan driver 410.

In some embodiments of the present invention, the first substrate 200 comprises multiple display devices and the second substrate 300 is bonded to the first substrate 200 as one unit. In the case where the first substrate 200 and the second substrate 300 are bonded as one unit, the process has an advantage in that process time can be shortened.

Figure 4:
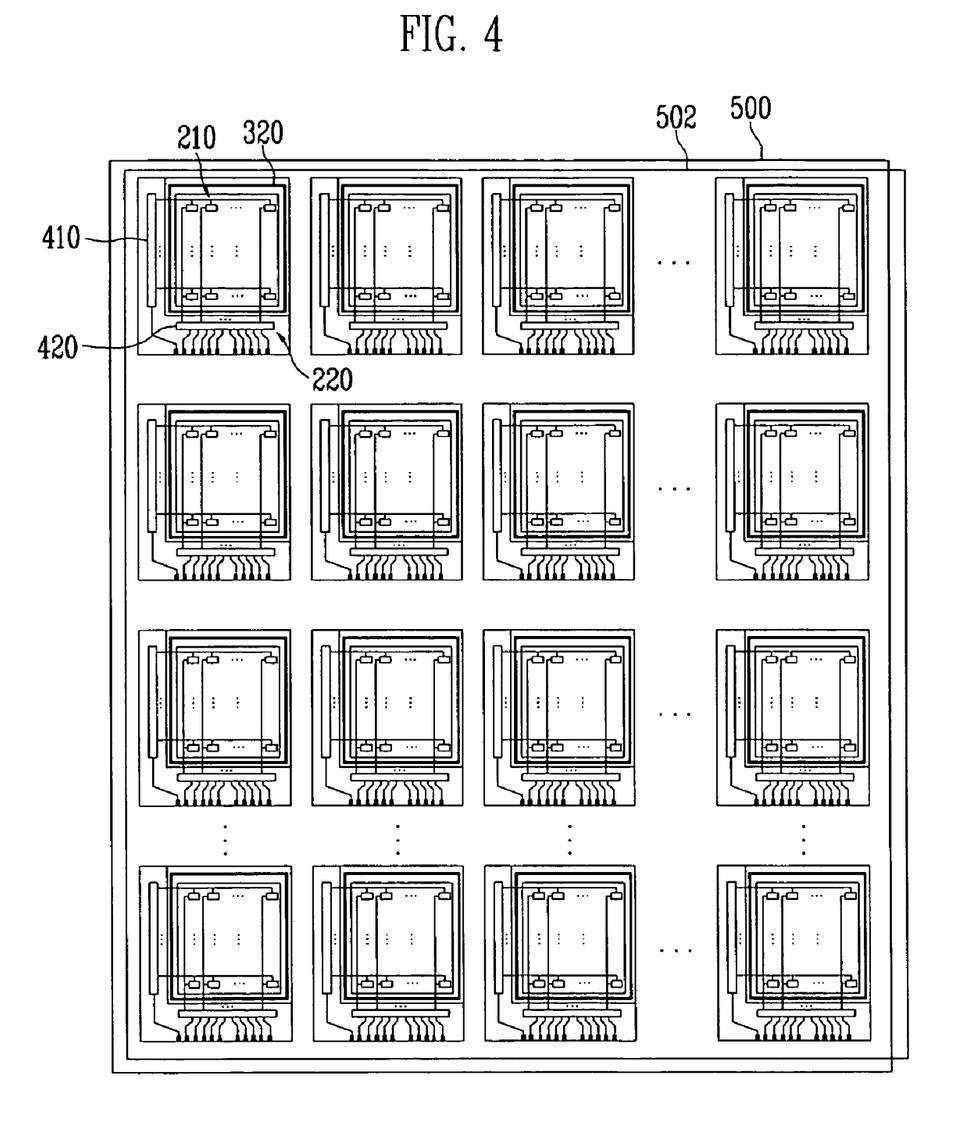
FIG. 4 is a schematic view showing an embodiment with multiple display devices on a first mother substrate bonded to a second mother substrate.

Describing these embodiments in more detail, in reference to FIG. 4, a first mother substrate 500 is formed with a plurality of pixel regions 210 and non-pixel regions 220. A second mother substrate 502 is formed with a plurality of frits 320, configured to surround the non-pixel regions 220 when the first mother substrate 500 and the second mother substrate 502 are contacted. After contacting the substrates, preferably only the frit portion 320 is irradiated with infrared rays to melt the frit, resulting in the first mother substrate 500 and the second mother substrate 502 being bonded. In some embodiments, the bonded first mother substrate 500 and the second mother substrate 502 are cut at a predetermined size to separate the individual organic light-emitting display devices formed on the first mother substrate 500 and encapsulated between the first mother substrate 500, the second mother substrate 502 and the frit 320. After cutting the individual display to a predetermined size, they may be cut once again so that they can be reduced to a size similar to that shown in FIG. 3.

Figure 5:
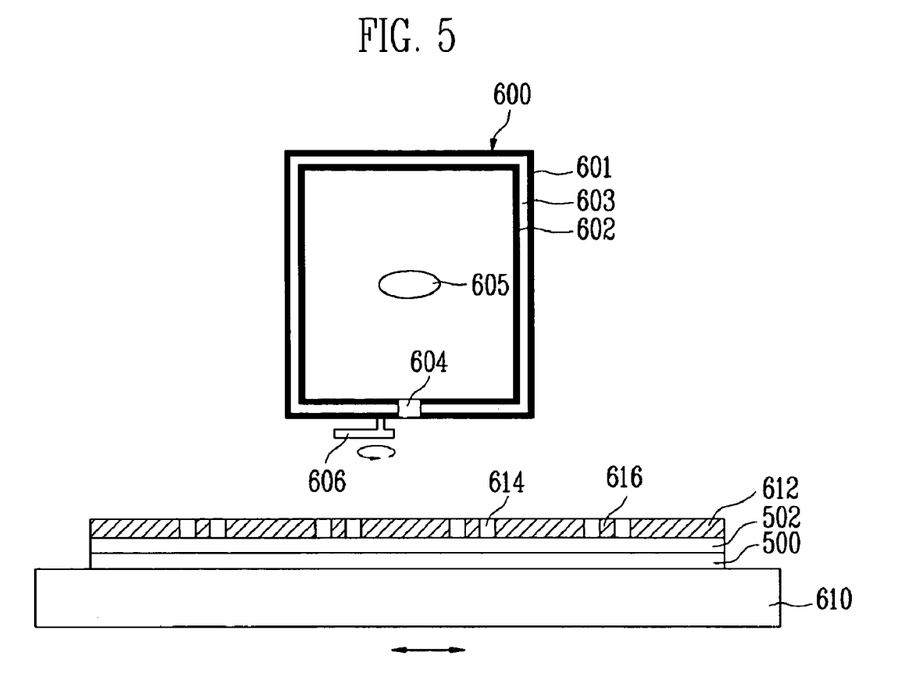
FIG. 5 is a view showing a frit sealing apparatus according an embodiment.

FIG. 5 shows a frit sealing apparatus according to an embodiment of the present invention. The frit sealing apparatus comprises a chamber 600 and a stage 610. The stage 610 may comprise a static surface such as a floor, or a mobile surface such as a table or a platform.

In the embodiment shown in FIG. 5, the chamber 600 comprises a first chamber 601, a second chamber 602, an emitting part 604, a lamp 605, and a heat-radiating shutter 606. This dual chamber embodiment is optional, and a single chamber 601 comprising the lamp 605, the emitting part 604, and the heat radiating shutter 606 may be used.

The first chamber 601 and the second chamber 602 are formed at a predetermined size so that the lamp 605 can be inserted inside thereof. Here, the second chamber 602 is formed inside the first chamber 601. In this embodiment, a cooling liquid (e.g., water) 603 is supplied between the first chamber 601 and the second chamber 602. The cooling liquid prevents the temperature of the first chamber 601 and the second chamber 602 from rising above acceptable levels. Those of skill in the art recognize liquids that may be used as the cooling liquid 603.

The lamp 605 is positioned inside the second chamber 602. The lamp 605 emits infrared rays. As a result, high heat is generated from the inside of the chamber part 600 due to radiation caused by the infrared rays. Meanwhile, the lamp 605 is fixedly positioned inside the second chamber 602. Since various methods for positioning the lamp 605 to be fixed in the second chamber 603 can be applied, they are not shown in FIG. 5. As one example, the lamp 605 can be fixedly installed by a supporting bar (not shown), which is projected from the upper side of the second chamber 602.

The emitting part 604 is configured and positioned so as to selectively direct the infrared rays produced by the lamp 605 onto the stage 610. The emitting part 604 emits infrared rays and radiation heat generated from the lamp 605 to the stage 610. To this end, the emitting part 604 can be made of transparent substance, for example, glass, etc. The emitting part 604 may be in the form of one or more slits, one or more apertures or one or more optical guide devices (e.g., one or more lenses and/or mirrors, etc.). The emitting part 604 is configured to direct and/or focus the infrared rays so as to concentrate them to an energy level that is sufficient to melt the frit as discussed below.

The heat-radiating shutter 606 is used for enabling and disabling the emitting part 604. For example, the heat-radiating shutter 606 is overlapped and positioned in front of the emitting part 604 to prevent the infrared rays and the radiation heat from being emitted from the emitting part 604 on to the stage. It may be desirable to position the shutter 606 in the overlapped position when the mother substrates 500 and 502 are not positioned on the stage 610, or when the substrates 500 and 502 are in the process of being positioned on the stage 610. Also, the heat-radiating shutter 606 is not overlapping the emitting part 604, thus enabling the emitting part 604 to supply the infrared rays and the radiation heat to the stage 610 when the mother substrates 500 and 502 are positioned on the stage 601.

Figure 6A:
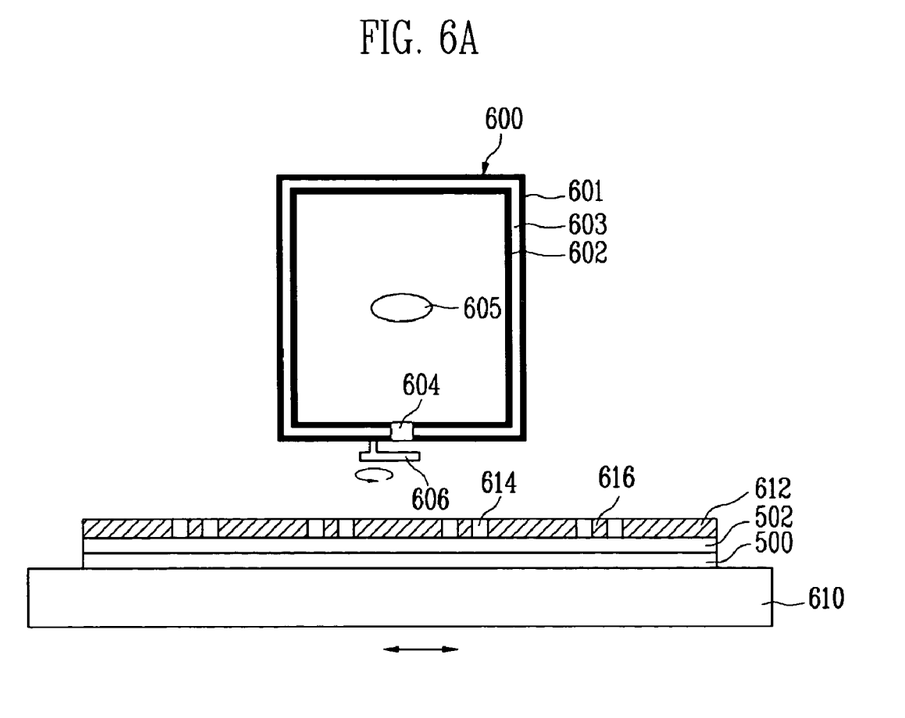
FIGS. 6a to 6c are views showing a process utilizing the frit sealing apparatus shown in FIG. 5.
Figure 6B:
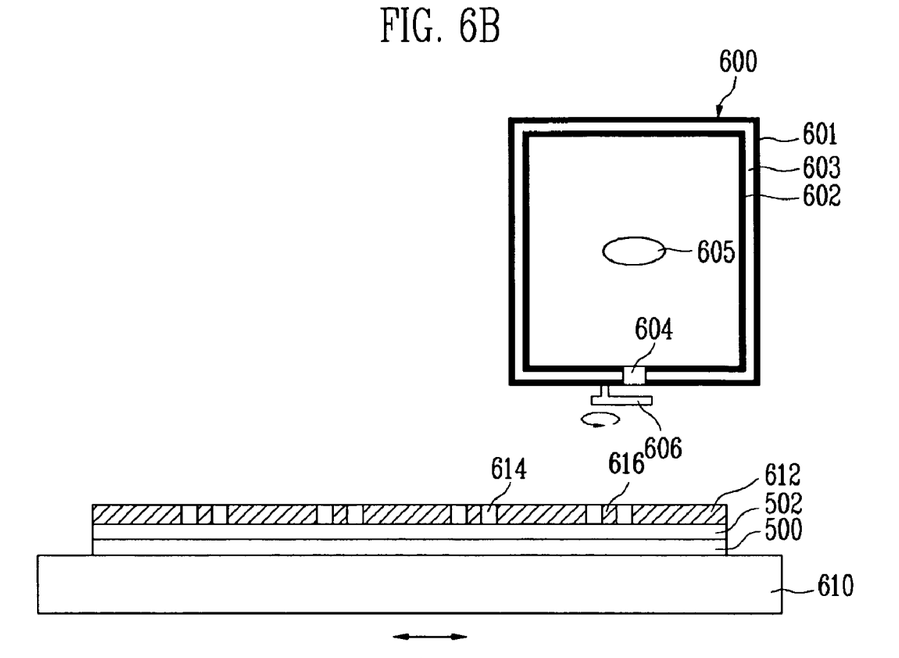
Figure 6C:
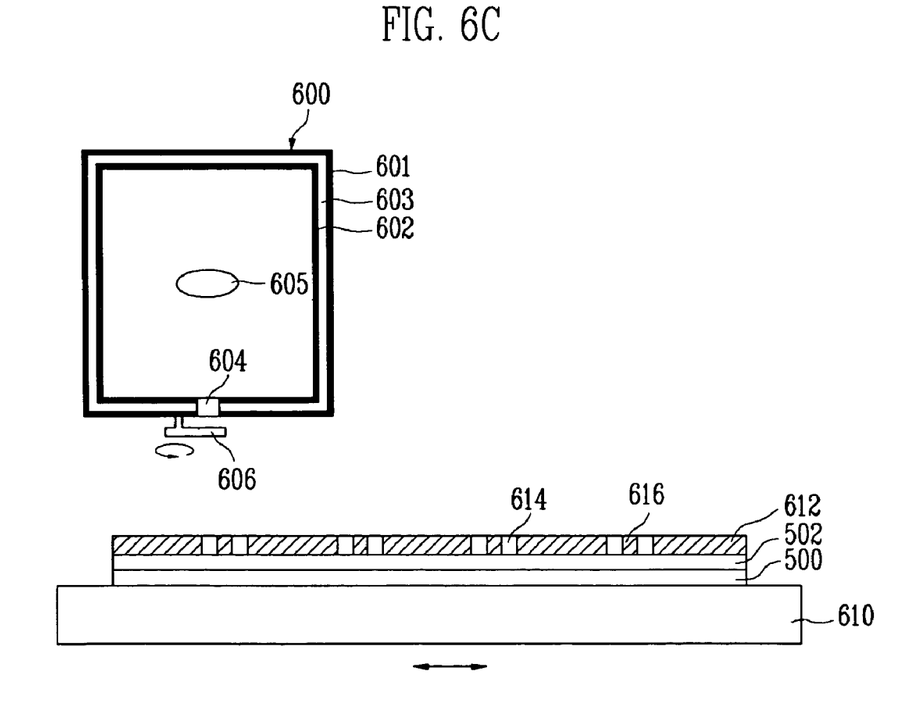

The stage 610 is configured to receive the mother substrates 500 and 502 and to securely fix them. In some embodiments, the stage 610 is translated relative to chamber part 600 (e.g., the stage is moved left to right and vice-versa as shown in FIGS. 6a to 6c and discussed below) to evenly supply the infrared rays and the radiation heat emitted from the emitting part 604 onto the overall area of the mother substrates 500 and 502. The stage 610 may be supported by a supporting bar (not shown) and translated by a motor (not shown). Here, since various methods for supporting the stage by the supporting bar while translating it can be applied, they are not shown in FIG. 5.

After the mother substrates 500 and 502 are fixed to the stage 510, a mask 612 is positioned over the mother substrates 500 and 502. The mask 612 comprises one or more interrupting or masking portions 616 and one or more transmitting portions 614. The interrupting portions 616 may be made of an opaque substance to prevent the infrared rays and the radiation heat supplied from the emitting part 604 from being supplied to portions (e.g., the pixel regions 210) of the mother substrates 500 and 502. The transmitting portions 614 may be made of transparent substance or transparent window (for example, a hole state) to supply the infrared rays and the radiation heat from the emitting part 604 toward portions of the mother substrates 500 and 502. In the embodiment shown in FIG. 5, the transmitting portions are positioned over the frit 320.

Describing an operation process, firstly, on the stage 610 the mother substrates 500 and 502 are stably fixed. Next, the mask 612 is positioned over the mother substrates 500 and 502, wherein the mask has the transmitting portions 614 formed at positions overlapping with the frit 320, is the frit 320 being positioned between the mother substrates 500 and 502. While the mother substrates 500 and 502 are being fixed onto the stage 610, the heat-radiating shutter 606 is covering the emitting part 604 as in FIG. 6 to prevent the infrared rays and radiation heat from being supplied to the mother substrates 500 and 502.

After the mother substrates 500 and 502 and the mask 612 are stably fixed on the stage 610, as shown in FIG. 5, the heat-radiating shutter 606 is opened to allow the infrared rays and radiation heat to be directed by the emitting part 604 onto the mother substrates 500 and 502. After the heat radiating shutter 606 is opened, the stage 610 moves left to right and back again as shown in the sequence of FIGS. 6a and 6c. As a result, the radiation heat and the infrared rays emitted from the emitting part 604 are supplied to the mask 612. In this case, the radiation heat and the infrared rays are supplied to the frit 320 positioned between the mother substrates 500 and 502 via the transmitting portions 614 of the mask 612. Thus, the frit is melted to bond the mother substrates 500 and 502.

It should be noted, that the example shown in FIGS. 5 and 6 the stage 610 being moved relative to the chamber part 600. This is not necessarily the case. In some embodiments, the chamber part 600 can be moved relative to the substrates 500 and 502. Such movement of the chamber part may be preferable, especially if the stage 610 comprises an immobile platform such as a floor. The relative motion between the stage 610 and the chamber part 600 may also be supplied by combined motions of both the stage 610 and the chamber part 600.

It should be noted that the example shown in FIGS. 5 and 6 illustrate one dimensional motion in from right to left, where the direction right to left is immaterial, as it could also be moved into and out of the page. This one dimensional type of relative motion may be sufficient if the emitting part 604 is able to focus the infrared rays and radiation heat over the width of the mother substrates 500 and 502 (where the width in this case is into the page as shown in FIGS. 5 and 6). In other embodiments, for example where the emitting part focuses the infrared rays on a portion of the substrates less than an entire width in one dimension, the relative motion may be provided in two dimensions in order to supply heat to all of the transmitting portions 614 and the underlying frit 320.

In the present invention, the mother substrates 500 and 502 are positioned outside of the chamber part 600. Accordingly, since high heat from the chamber part 600 is not supplied to the portions of the mother substrates 500 and 502 that are blocked by the interrupting portions 616 of the mask 612, the deterioration problem caused by supplying high heat to all areas of the mother substrates 500 and 502 can be prevented (for example, deterioration of pixels 100). Also, since the mother substrates 500 and 502 are formed outside the chamber part 600, the size of the chamber part 600 can be small to reduce the size of the frit sealing apparatus accordingly. Further, since the invention transfers the infrared rays and the radiation heat only to the frit 302 using the mask 612, the deterioration in the pixel region 210 due to high heat can be prevented.

The design variables that define the various parts of the frit sealing apparatus and processes described above can be determined without undo experimentation by one of skill in the art. The design variables include the power of the infrared lamp 605, the concentrating or focusing characteristics of the emitting part 604, the distance between the emitting part 604 and the mask 612 and the substrates 500 and 502, the speed at which the substrates 500 and 502 are moved relative to the chamber part 600, and the duration for which the heat is supplied to the substrates, etc. These design variables can be engineered to supply sufficient heat energy to the frit 320 to melt it, while keeping the temperature of the heat sensitive portions of the substrates 500 and 502 (e.g., the pixel regions containing organic light emitting pixels 100) below temperatures that may cause damage.

As described above, since the frit sealing apparatus and method of using the same supplies the infrared rays and the radiation heat only to frit containing portions of the substrates being bonded, the deterioration in the pixel region(s) due to high heat can be prevented. Also, since the frit is cured in a single unit comprising multiple encapsulated devices, working time can be shortened. And, since the mother substrates are positioned outside of the heat chamber, the size of the frit sealing apparatus can be reduced.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. A frit sealing apparatus, comprising:
 a platform comprising a receiving surface configured to receive an unfinished electronic device;
 a radiation source configured and arranged to radiate a ray toward the platform; and
 a mask located between the radiation source and the platform and directly or indirectly stably fixed to the platform, the mask comprising one or more masking portions configured to substantially block the ray from reaching the platform, the mask further comprising one or more transmitting portions configured to substantially allow the ray to reach the platform;
 wherein the platform and the radiation source are configured to slide relative to each other; and
 wherein the radiation source comprises:
 a chamber comprising a wall enclosing a chamber;
 a lamp positioned in the chamber; and
 a slit formed in the chamber, the slit configured to emit radiation from the lamp outside the chamber and directed to the platform.

2. The apparatus of claim 1, wherein the radiation source comprises an infrared emitting device.

3. The apparatus of claim 1, wherein the radiation source further comprising a coolant contacting the wall of the chamber.

4. The apparatus of claim 1, further comprising the unfinished electronic device comprising a first substrate, a second substrate, an array of organic light emitting pixels and a frit, the array interposed between the first and second substrates, the frit interposed between and contacting the first and second substrates while surrounding the array.

5. The apparatus of claim 4, wherein the transmitting portions substantially allow the ray to radiate at least a portion of the frit of the unfinished electronic device, and the masking portions substantially block the ray from radiating at least a portion of the array.

6. The apparatus of claim 4, wherein the unfinished electronic device further comprises one or more additional arrays of organic light emitting pixels interposed between the first and second substrates, and one or more additional fits interposed between and contacting the first and second substrates, and wherein one of the one or more additional fits surrounds one of the one or more additional arrays.

7. The apparatus of claim 1, further comprising a mechanism configured to slide the platform relative to the radiation source.

\* \* \* \* \*